United States Patent [19]

Fujii et al.

[11] Patent Number: 5,410,180
[45] Date of Patent: Apr. 25, 1995

[54] METAL PLANE SUPPORT FOR MULTI-LAYER LEAD FRAMES AND A PROCESS FOR MANUFACTURING SUCH FRAMES

[75] Inventors: Hirofumi Fujii; Yoshiki Takeda; Mitsuharu Shimizu, all of Nagano, Japan

[73] Assignees: Shinko Electric Industries Co., Ltd., Nagano, Japan; Intel Corporation, Santa Clara, Calif.

[21] Appl. No.: 95,516

[22] Filed: Jul. 26, 1993

[30] Foreign Application Priority Data

Jul. 28, 1992 [JP] Japan ................. 4-221942

[51] Int. Cl.6 ............... H01L 23/48; H01L 29/44; H01L 29/52; H01L 29/60
[52] U.S. Cl. ...................... 257/666; 257/691
[58] Field of Search ................ 257/666, 691

[56] References Cited

U.S. PATENT DOCUMENTS

| | | | |
|---|---|---|---|
| 4,801,999 | 1/1989 | Hayward et al. | 257/691 |
| 4,891,687 | 1/1990 | Mallik et al. | 257/691 |
| 4,953,007 | 8/1990 | Erdos | 257/666 |
| 5,089,878 | 2/1992 | Lee | 257/666 |
| 5,119,169 | 6/1992 | Konzo et al. | 257/691 |
| 5,196,725 | 3/1993 | Mita et al. | 257/666 |
| 5,304,818 | 4/1994 | Go | 257/669 |

FOREIGN PATENT DOCUMENTS

| | | |
|---|---|---|
| 0228869 | 7/1987 | European Pat. Off. . |
| 0457593 | 11/1991 | European Pat. Off. . |
| 4-25163 | 1/1992 | Japan . |
| 4-25165 | 1/1992 | Japan . |

*Primary Examiner*—Andrew J. James
*Assistant Examiner*—S. V. Clark
*Attorney, Agent, or Firm*—Staas & Halsey

[57] ABSTRACT

A metal plane support structure of a semiconductor device multi-layer lead frame having one or more metal planes, of different types, arranged in stacked and aligned relationship with and adhered to a corresponding lead frame. Metal planes of a common type are defined in a corresponding metal strip, at longitudinally spaced positions, the metal strip having a pair of side rails along the longitudinal edges thereof, integral support bars extending transversely of the side rails and interconnecting the metal planes to the side rails and section bars extending between and integrally interconnecting the side rails, each section bar disposed between two adjacent metal planes. Separating portions are formed in aligned relationship in the support bars and section bars. The lead frames are defined, further, at longitudinally spaced positions corresponding to the spacing of the metal planes, in a further metal strip having a smaller transverse dimension than that of each metal plane strip. In the assembled relationship of each metal plane with a corresponding lead frame, the side rails are diposed outwardly, in a transverse direction, from the side edges of the lead frame metal strip and are readily removed, along with the support bars and section bars, at the respective separating portions.

26 Claims, 6 Drawing Sheets

METAL PLANE SUPPORT FOR MULTI-LAYER LEAD FRAMES AND A PROCESS FOR MANUFACTURING SUCH FRAMES

BACKGROUND OF THE INVENTION

1. Field of the Invention

This invention relates to a metal plane support for making multi-layer lead frames adapted to be used for semiconductor devices. This invention also relates to a process for manufacturing multi-layer lead frames using such a metal plane support.

2. Related Art

Figure 9:
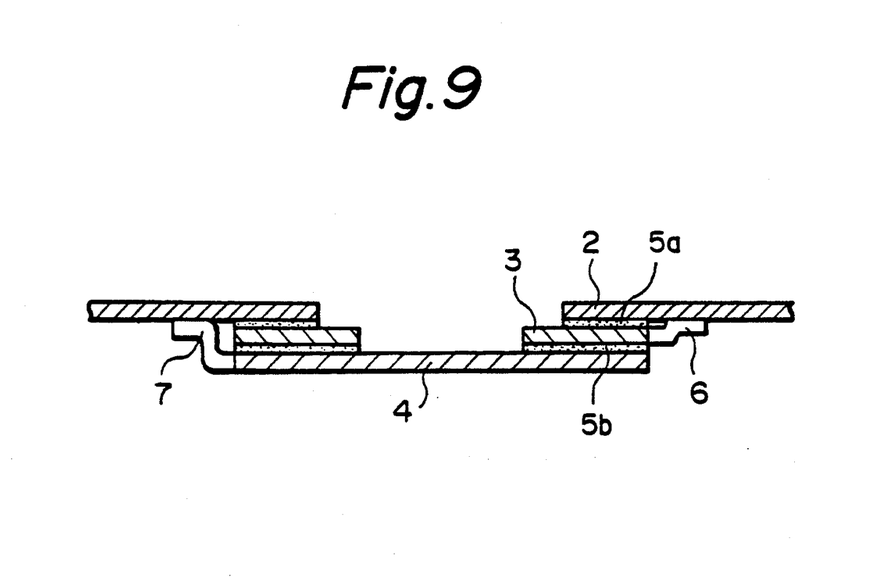
FIG. 9 is a cross-sectional view of a multi-layer lead frame known in the prior art.

As shown in FIG. 9, a conventionally known multi-layer lead frame comprises a lead frame 2 and at least one metal plane, such as a power-supply plane 3, a ground plane 4, and the like, laminated by means of electrically insulating layers 5a and 5b made of suitable resin material, such as polyimide or the like. These electrically insulating layers 5 (5a and 5b) serve for electrically insulating the respective layers, i.e., the lead frame 2, the power-supply plane 3 and the ground plane 4 and also to adhere the respective layers together thereby to form a unitary multi-layer lead frame.

Although the multi-layer lead frame shown in FIG. 9 has a structure of three layers, such a multi-layer lead frame may be a two-layer structure comprising a single metal plane, i.e., a power-supply plane or a ground plane. Moreover, such a multi-layer lead frame may be a structure having four or more layers.

The power supply plane 3 and the ground plane 4 are electrically connected to power-supply leads and ground leads of the lead frame 2, respectively, and therefore maintained at predetermined voltages, respectively. In order to attain this, the power-supply plane 3 and the ground plane 4 have extensions 6 and 7 protruding outwardly from predetermined positions of the outer peripheries thereof. Thus, after the power-supply plane 3, the ground plane 4 and the lead frame 2 are laminated together by means of electrically insulating layers 5a and 5b, these extensions 6 and 7 are electrically connected to the power supply leads and the ground leads of the lead frame 2, respectively, by spot welding, laser beam welding, or the like.

Although FIG. 9 shows an example in which the second, intermediate layer is a power-supply plane 3 and the lowermost layer is a ground plane 4, a multi-layer lead frame in which the second layer is a ground plane and the lowermost layer is a power-supply plane is also known in the prior art.

When manufacturing a multi-layer lead frame by laminating the power supply plane and the ground plane onto the lead frame, as mentioned above, the power-supply plane and the ground plane must be accurately positioned with respect to the lead frame. Also, these layers must be firmly adhered to each other while remaining insulated, and a reliable and effective manufacturing method must be attained.

SUMMARY OF THE INVENTION

An object of the present invention is to provide a metal plane support for making multi-layer lead frames, in which a plurality of multi-layer lead frames continuously connected in the longitudinal direction can effectively and accurately be manufactured.

Another object of the present invention is to provide a process for manufacturing multi-layer lead frames using such a metal plane support.

According to the present invention, there is provided a metal plane support for making multi-layer lead frames adapted to be used for semiconductor devices; a lead frame support made of a single thin metal strip having a plurality of lead frames continuously arranged in the longitudinal direction; said metal plane support being also made of a single thin metal strip and comprising a plurality of metal planes, such as power-supply planes, ground planes or the like, continuously arranged in the longitudinal direction corresponding to said plurality of lead frames; a pair of side rails, extending in the longitudinal direction, for supporting said plurality of metal planes therebetween and means for connecting said metal planes to said rails, said connecting means including separating portions for removing said rails from said metal planes, after said metal planes are adhered to said corresponding lead frames.

A process for making multi-layer lead frames using the above-mentioned metal plane support and the lead frame support, comprises the steps of adhering said metal plane support to said lead frame support by means of an electrically insulating means, in such a manner that the respective metal planes are accurately positioned with respect to the respective lead frames; and bending said side rails of the metal plane support to remove said side rails from said metal planes along said separating portions.

It is advantageous that the width of said metal plane support is larger than the width of said lead frame support, in such a manner that said pair of side rails of said metal plane support protrude outwardly from side edges of said lead frame support, when said metal planes are adhered to said corresponding lead frames, so that said side rails are bent by grippers for gripping said side rails.

DESCRIPTION OF THE PREFERRED EMBODIMENTS

Referring now to the accompanying drawings, some preferred embodiments according to the present invention will now be described in detail.

Figure 1:
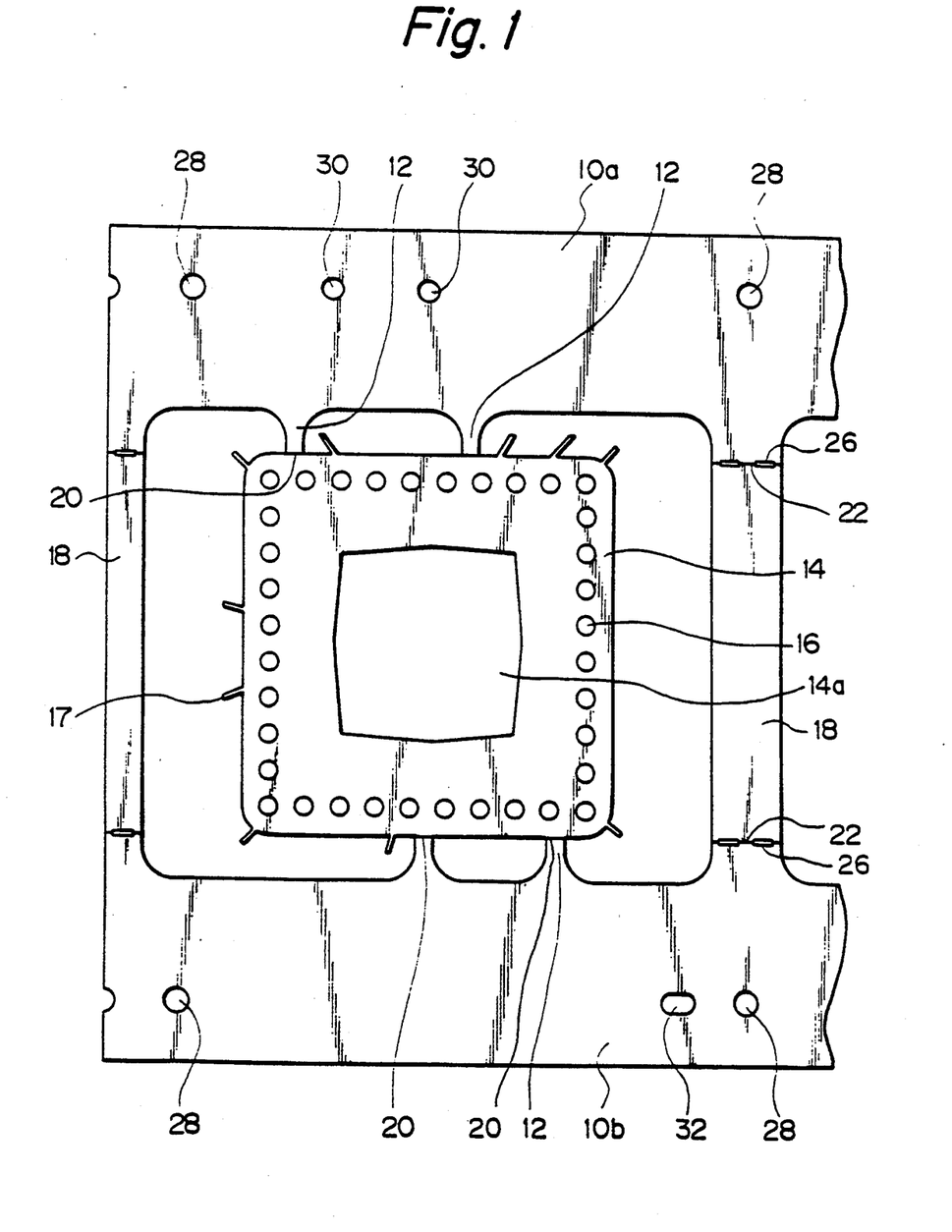
FIG. 1 is a plan view of an embodiment of a power supply plane support.
Figure 2:
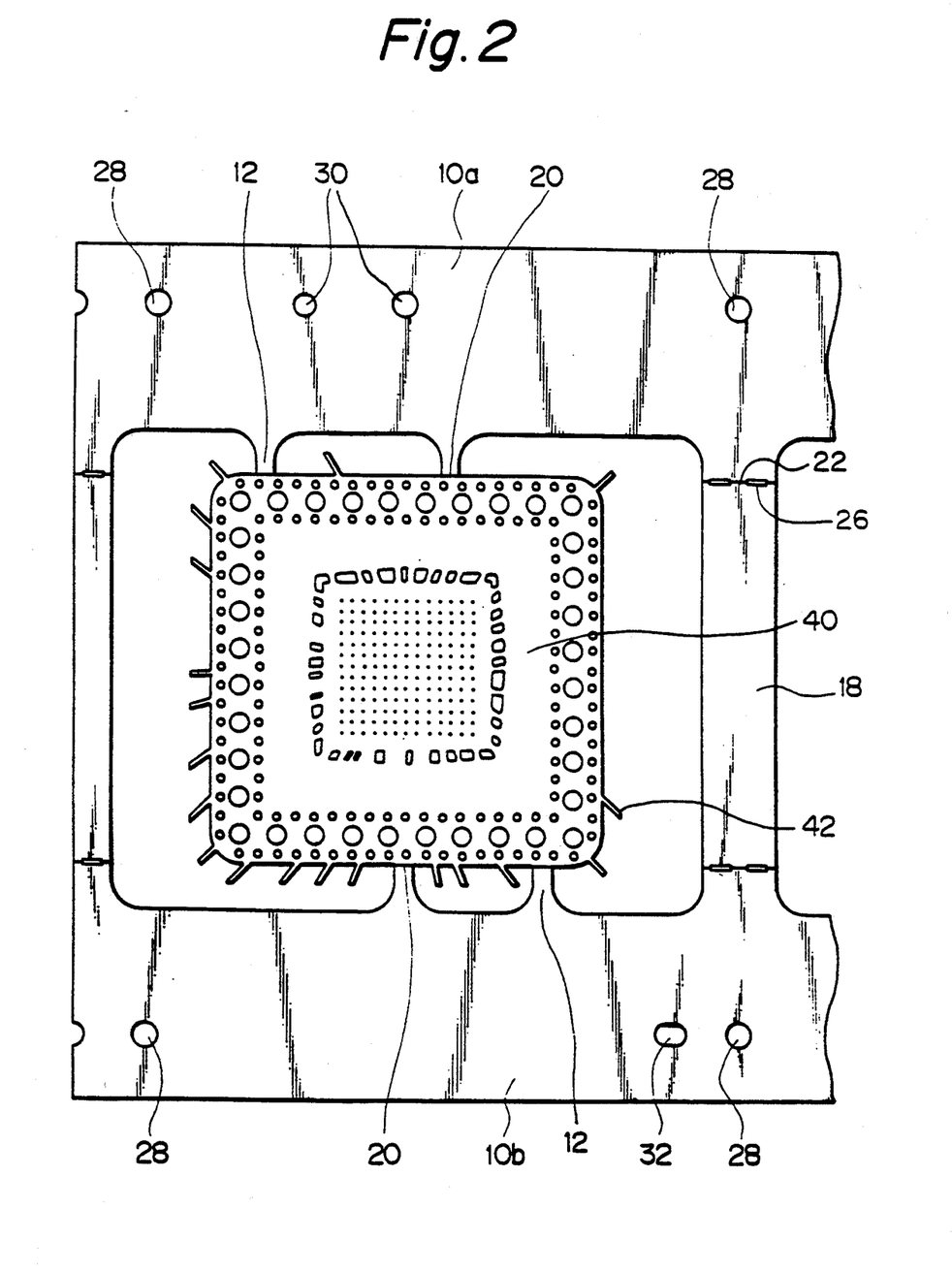
FIG. 2 is a plan view of an embodiment of a ground plane support.

In FIGS. 1 and 2, metal plane supports for making multi-layer (three-layer) lead frames according to the present invention are shown, in which FIGS. 1 and 2 show a power-supply plane support and a ground plane support, respectively. The power supply plane support is made of a single thin metal strip and comprises a pair of side rails 10a and 10b which support power supply planes 14 by means of support bars 12. The power-supply plane 14 defines a rectangular frame shape having a rectangular central opening 14a. In the embodiment shown in FIG. 1, the power-supply plane 14 is supported by the side rails 10a and 10b in such a manner that each of the opposite edges of the outer periphery of the power-supply plane 14, parallel to the side rails 10a and 10b, respectively, is connected thereto by means of two associated and corresponding support bars 12.

Although FIG. 1 illustrates only a single complete section or unit of the power-supply plane 14, as shown by the frequent of a successive such section at the right edge of the structure illustrated in FIG. 1, a plurality of power-supply planes 14 are supported by this power-supply plane support structure in such a manner that plural power supply planes 14 are continuously arranged in spaced relationship in a longitudinal direction. Transverse section bars 18 are arranged between the two side rails 10a and 10b to connect them to each other and each thereof positioned between two adjacent power supply planes 14. The section bars 18 serve to increase the strength of the power-supply plane support structure so as to prevent deformation of the power supply plane support, which deformation would make it impossible to position the power-supply plane support accurately.

The above-mentioned guide rails 10a and 10b, the support bars 12 and the section bars 18 are unnecessary in the final products and, therefore, they are removed after the power supply plane is adhered to the lead frame.

Therefore, the boundary portions between the support bars 12 and the power supply plane 14 and between the section bars 18 and the side rails 10a and 10b are provided with separating portions 20 and 22, respectively. The separation of the support bars 12 and the section bars 18 can be effected by bending or folding the side rails 10a and 10b about the separating portions 20 and 22 as pivots. Thus, in order to easily bend and separate the side rails 10a and 10b, the separating portions 20 and 22 are provided with etched or cut grooves.

Figure 4:
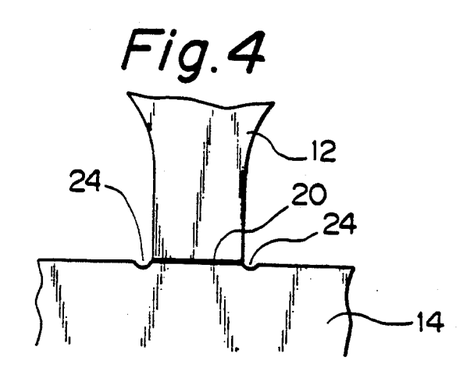
FIG. 4 is an enlarged partial plan view of a separating portion of a support bar.

FIG. 4 is an enlarged partial plan view of the separating portion 20 formed on the support bar 12. The separating portion 20 is formed as a fine groove across the support bar 12 and, therefore, the thickness of this portion is reduced so as to easily separate thereat.

When separating the support bar 12 from the power supply plane 14, it is necessary to prevent burrs from being formed at the outer periphery of the power-supply plane 14.

Such burrs might cause an electrical short circuit between planes, when the power-supply plane 14 is laminated to the other plane or planes. In this embodiment, therefore, as shown in FIG. 4, cut portions 24, indented toward the power supply plane 14, are formed at the positions where the support bar 12 is connected to the power supply plane 14. Also, the cut line of the separating portion 20 for separating the support bar 12 is made in conformity with the outer peripheral edge of the power supply plane 14.

Figure 5:
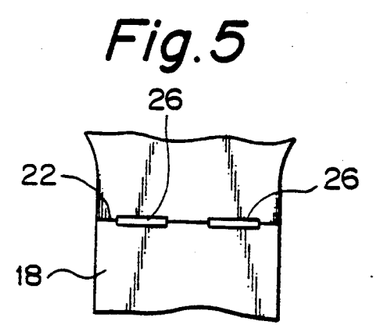
FIG. 5 is an enlarged partial plan view of a separating portion of a section bar.

FIG. 5 is an enlarged partial plane view of a separating portion 22 of the section bar 18. In the same manner as the separating portion 20 of the support bar 12, the separating portion 22 is formed by a fine groove along a line across the section bar 18, but a slot or slots 26 are provided along the fine groove. As the section bars 18 support structure the power-supply plane support, the section bar 18 has a relatively large width compared to the support bar 12. Therefore, these slots 26 are formed for providing a reliable method of removing the relatively wide section bar 18 by bending or folding the guide rails 10a and 10b. Such slots 26 can be formed by a known method, such as etching or the like.

The separating portions 20 and 22 of the support bars 12 and the section bars 18 may be provided as uncontinuous broken lines; moreover, it is not always necessary to extend them to side edges of bars.

As the support bars 12 and the section bars 18 are removed as a whole by bending or folding the guide rails 10a and 10b about the separating portions 20 and 22, respectively, the respective separating portions 20 and 22 must be located on straight lines (i.e., in aligned relationship with each other, at the respective, opposite parallel peripheral edges of the plane 14). Since the separating portions 20 of the support bars 12 correspond to the outer, longitudinally extending peripheral edges of the power-supply plane 14 parallel to the side rails 10a, 10b, both the separating portions 20 and 22 are located above straight lines respectively corresponding to and parallel to the outer longitudinally extending peripheral edges of the power-supply plane 14.

As shown in FIG. 1, the power-supply plane 14 is provided with a plurality of through holes 16 for improving the sealing characteristic with a sealing resin and connecting projections 17 which serve to make electrical connections between the power supply plane 14 and the lead frame. Also, an adhesive insulating tape is attached on the surface of the power supply plane 14 to adhere the same to the lead frame and to provide electrical insulation therebetween.

The adhesive insulating tape has a square frame shape so that the entire area of the power-supply plane 14 is covered by the adhesive insulating tape, except the inner peripheral area of the power supply plane 14 which is used as a wire-bonding area. Thus, the adhesive insulating tape is attached on the surface of the power supply plane 14 after the power-supply plane support is formed, by an etching or punching process, to a prescribed shape.

In the operation of adhering the adhesive insulating tape onto the power supply plane, such a tape is supplied perpendicularly to the longitudinal direction of the power supply plane support. In this case, in order to accurately position the adhesive insulating tape with respect to the power-supply plane support, the side rails 10a and 10b are provided with positioning guide holes 28. The positions of the guide holes 28 on the side rails 10a and 10b are determined on the basis of the width of the adhesive tape, the width of the power supply plane 14, and the like, in such a manner that the adhesive insulating tape can easily be fed perpendicularly to the longitudinal direction of the power supply plane support.

The side rails 10a and 10b are also provided with guide holes 30 which are used for positioning the power-supply plane support with respect to the lead frame. The reference numeral 32 denotes an elongated hole which is used for pressingly adhering the power supply plane support to the lead frame support.

FIG. 2 shows a ground plane support which is to be adhered to the bottom of the power-supply plane support shown in FIG. 1. The general construction of the ground plane support is substantially the same as that of the power supply plane support. Consequently, the ground plane support comprises side rails 10a and 10b which support a ground plane 40 by means of support bars 12. The side rails 10a and 10b are connected to each other by means of section bars 18. The support bars 12 and the section bars 18 are provided with separating portions 20 and 22, respectively, in the same manner as the power supply plane support, as mentioned above. The positions of these separating portions 20 and 22 are similar to those of the power supply plane support.

The ground plane 40 has an outer peripheral size corresponding to that of the power-supply plane 14 and is provided with connecting projections 42 for electrically connecting the ground plane 40 to the lead frame.

As the ground plane 40 is adhered to and laminated on the power-supply plane 14, an insulating adhesive tape is attached on a surface of the ground plane 40 which the power-supply plane 14 faces. The adhesive tape has a square frame shape corresponding to the shape of the power-supply plane 14.

In the same manner as the power-supply plane support, the ground-plane-support is provided with a plurality of guide holes 28 for positioning the insulating adhesive tape, and guide holes 30 for positioning the ground plane support, with respect to the lead frame support.

These independent guide holes 28 and 30 serve to accurately position the adhesive tape with respect to each of the power supply support (FIG. 1) and the ground plane support (FIG. 2), and each of these power supply and ground plane supports with respect to the lead frame support. In this case, an advantage can be obtained in that a common tape adhering apparatus or a common mold can be used, if the power supply plane 14 has the same size as the ground plane, even though the arrangement interval of the power supply planes is different from that of the ground planes.

The separating portions 20 and 22 of the power-supply-plane-support or the ground-plane support are provided on a surface thereof opposite to the surface to which the adhesive tape is attached, i.e., the surface of the lead frame support to which another support is adhered. This is because an electrical short-circuit which might occur between the layers can be prevented, even if burrs are formed when removing the side rails 10a and 10b from the plane, after the lead-frame support, the power-supply-plane support and the ground-plane support are laminated together.

Figure 3:
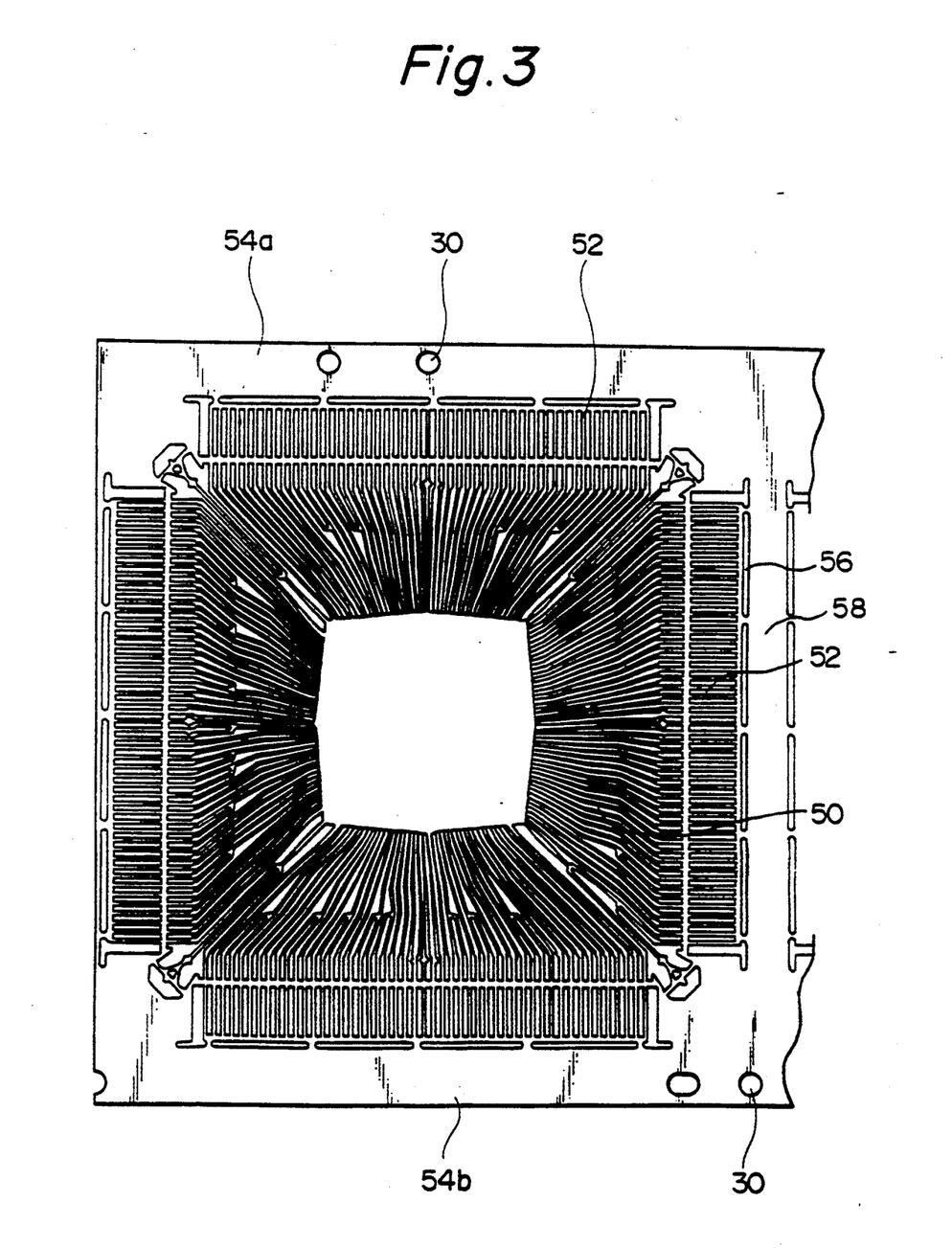
FIG. 3 is plan view of an embodiment of a lead frame support.

FIG. 3 shows an embodiment of the lead-frame support with which the power-supply-plane support and the ground-plane support are assembled and to which they are adhered. The lead-frame support comprises a plurality of lead frames continuously arranged in the longitudinal direction (see fragment of further such support at right edge in structure illustrated in FIG. 3). The lead frame includes inner leads 50 formed to enclose a semiconductor chip mount area and their outer leads 52 supported by side rails 54a and 54b and transverse section bars 58.

The lead-frame support is provided with guide holes 30 for accurately positioning the power-supply-plane support and the ground-plane support with respect to the lead frame support.

The width of the lead frame support is smaller than that of the power-supply-plane support and the ground-plane support. Therefore, the respective side rails 10a and 10b of the power-supply-plane support and the ground-plane support protrude outwardly from the side edges of the lead frame support and, therefore, can easily be clamped (i.e., enlarged, or gripped) for bending and removing the same, after the power supply plane support and the ground plane support are laminated to the lead-frame support.

Using the above-mentioned lead frame support, power supply plane support and ground plane support, a plurality of multi-layer lead frames can be made by the following steps.

First, insulating adhesive tapes are initially attached to the respective ground planes and also insulating adhesive tapes are initially attached to the respective power supply planes. Then, the lead frame support is positioned by inserting guide pins (not shown) into the respective and aligned guide holes 30 and 32 of the ground plane support and the power supply plane support. The respective laminated frames, continuously arranged in the longitudinal direction, are pressed together by a suitable jig and heated to a predetermined temperature, so that the respective ground planes 40 and power supply planes 14 are pressed together with, and adhered with respect to, the respective lead frames. After being pressed and adhered, the power-supply planes 14 and the ground-planes 40 are completely fixed to the respective lead-frames and, if necessary, a curing process is added to this operation.

Figure 6:
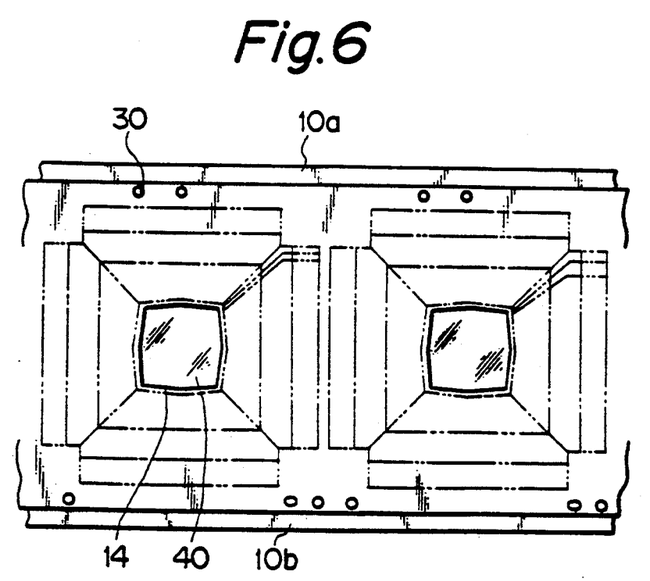
FIG. 6 is a plan view illustrating a laminated structure in which the power-supply plane support and the ground plane support are adhered to the lead frame support.

FIG. 6 shows a laminated structure in which the ground-plane support and the power-supply-plane support are laminated to the lead-frame support. As can be clearly understood, the power-supply-planes 14 and the ground-planes 40 are accurately positioned and adhered to the respective lead frames. Since the width of each of the power-supply-plane support and the ground-plane support is larger than that of the lead frame support, the respective side rails 10a and 10b of the power supply plane support and the ground plane support project outwardly from the side edges of the lead frame support.

Figure 7:
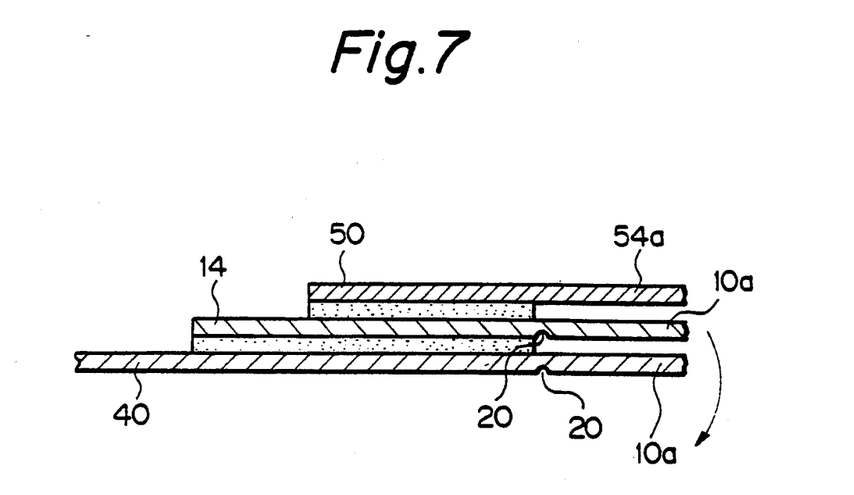
FIG. 7 is a partial cross-sectional view illustrating a laminated structure in which the power-supply plane support and the ground plane support are adhered to the lead frame support.

FIG. 7 shows the separating portions of the power supply plane support and the ground plane support, as so laminated to the lead frame support 50. As mentioned above, since the respective separating portions 20 and 22 are formed on the respective surfaces of the power supply plane support and the ground plane support which are opposite to (i.e., remote form) the lead frame in the assembled relationship thereof, as shown in FIG. 7, the separating portions 20 and 22 are located under (i.e., on the lower surfaces of) the respective planes 14 and 40, in the orientation of FIG. 7.

Figure 8:
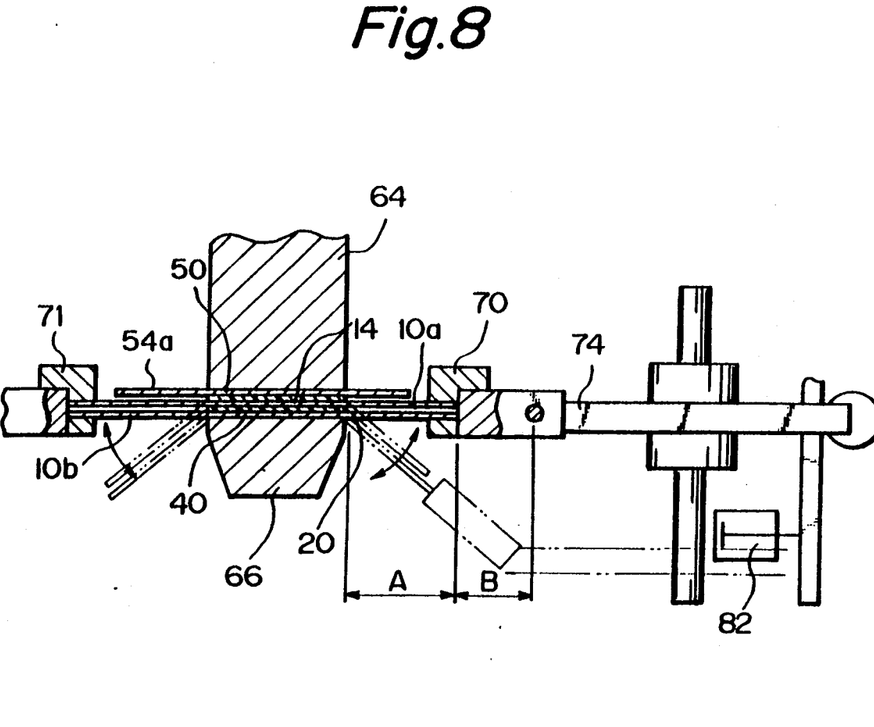
FIG. 8 is a schematic illustration ,of an apparatus for separating the unnecessary parts from the multi-layer lead frame.

FIG. 8 shows a separating and removing apparatus. The laminated structure of the power supply plane support, the ground plane support and the lead frame support is first clamped between an upper die 64 and a lower die 66. The side rails 10a and 10b of the power supply plane support and the ground plane support are then clamped by grippers 70 and 71. Drive arms 74 (only one is seen in FIG. 8, but one or more others are provided and effectively hidden in FIG. 8 by the first such drive arm 74) are moved up and down several times by an air cylinder 82, in such a manner that the side rails 10a and 10b are bent or folded several times alternatively away from and toward the opposed side of the lead frame support and about the separating portions 20 and 22, by the grippers 70 and as shown by double-headed arrows in FIGS. 7 and 8. It is preferable that a bending stroke of the grippers 70 is gradually reduced, while a bending speed is gradually increased. Thus, the support bars 12 and the section bars 18 are broken off, or released, along the separating portions 20 and 22, to permit removal thereof. The laminated power supply planes 14, the ground planes 40 and the lead frames remain grasped, or clamped, by the upper and lower dies.

After the side rails 10a and 10b and the section bars 18 are removed, the connecting projections are electrically connected to predetermined leads of the lead frame by a spot-welding, laser beam welding, or the like, so that the power supply plane 14 and the ground plane 40 are electrically connected to the lead frame. A multi-layer lead frame is thus obtained.

Although preferred embodiments and modifications of this invention have been described above with reference to the drawings, it should be understood that the scope of this invention is not limited to such embodiments or modifications, and that other modifications can be made by a person skilled in the art within the scope or spirit of this invention as claimed in the attached claims.

For example, in the above embodiment, although the frame widths of the power supply plane support and the ground plane support are the same, it is also possible to make the ground-plane support wider than the power-supply-plane support.

In the above embodiment, the widths of the power-supply-plane support and the ground-plane support are larger than the width of the lead-frame support, so that the side rails can easily be gripped and bent. However, the widths of the lead-frame support, the power-supply-plane support and the ground-plane support may be the same, but the side edges of the lead frame support may be provided with recesses, so that the side rails can be gripped through these recesses.

In the above embodiment, although the multi-layer lead frame has three layers, the present invention can also be applied to a multi-layer lead frame having two layers or four or more layers. Also, an adhesive tape may be attached beforehand to either of the respective, opposed surfaces of adjacent such layers which are to be adhered to each other.

We claim:

1. A metal plane support in combination with a lead frame support for fabricating semiconductor device multi-layer lead frames, the lead-frame support being made of a first elongated thin metal strip having spaced, longitudinal side edges and a plurality of lead frames arranged therein at successive, spaced positions in the longitudinal direction, said metal plane support being made of a second elongated thin metal strip and comprising:

a plurality of metal planes arranged at successive, spaced positions in the longitudinal direction in the second elongated thin metal strip and corresponding to said plurality of lead frames;

a pair of spaced side rails extending in the longitudinal direction, said plurality of metal planes being disposed therebetween; and means for connecting said metal planes to, and thereby supporting said metal planes between, said pair of side rails, said connecting means including separating portions for removing said pair of side rails from said metal planes when said metal planes are adhered to said corresponding lead frames.

2. A metal plane support as set forth in claim 1, wherein the dimension of said metal plane support, transverse to the longitudinal direction, is larger than the dimension of said lead frame support, transverse to the longitudinal direction, such that said pair of spaced side rails of said metal plane support protrude outwardly, in the transverse direction, from the respective, spaced side edges of said lead frame support when said metal planes are adhered to said corresponding lead frames.

3. A metal plan support as set forth in claim 1, wherein said connecting means comprise transversely extending support bars, each support bar having said respective separating portion thereof extending in the longitudinal direction.

4. A metal plane support as set forth in claim 2, wherein each said support bar has an integral connection to said metal plane along a portion of a corresponding, outer peripheral edge of said metal plane, the portion having first and second ends, and further comprising first and second indentations in the metal plane, respectively contiguous the first and second ends of the portion, and extending into the metal plane from the corresponding outer peripheral edge.

5. A metal plane support as set forth in claim 4, wherein each said metal plane has first and second major surfaces defining therebetween a first thickness dimension of said metal plane and said separating portion comprises a groove extending inwardly thereof from a corresponding one of the first and second main surfaces thereof to a second thickness dimension approximately one-half the first thickness dimension.

6. A metal plane support as set forth in claim 5, wherein said first main surface of said metal plane support defines a corresponding first main surface of each said metal plane to which said corresponding lead frame is adhered and each said groove extends inwardly of the second main surface of said metal plane support.

7. A metal plane support as set forth in claim 1, wherein said metal plane support further comprises section bars, each said section bar extending transversely to and integrally interconnecting said pair of side rails, each said section bar being disposed intermediate two adjacent and successive said metal planes and having respective separating portions therein adjacent the integral connections thereof with said pair of side rails.

8. A metal plane support as set forth in claim 7, wherein each said separating portion of each said section bar comprises a groove extending into the thickness of the metal plane from one of the first and second main surfaces thereof to a second thickness dimension approximately one-half the first thickness dimension.

9. A metal plane support as set forth in claim 8, wherein each said separating portion of each said section bar comprises at least one slot disposed along said groove and extending through said metal plane support.

10. A metal plane support as set forth in claim 8, wherein said first main surface of said a metal plane support defines a corresponding first main surface of each said metal plane to which said corresponding lead frame is adhered and each said groove extends inwardly of the second main surface of said metal plane support.

11. A metal plane support as set forth in claim 3, wherein said metal plane further comprises:

second connecting means comprising section bars extending transversely to and integrally interconnecting said pair of side rails, each section bar being disposed intermediate two adjacent and successive said metal planes and having respective separating portions extending in the longitudinal direction; and said respective separating portions of said support bars and said section bars being located along common longitudinal lines.

12. A metal plane support as set forth in claim 1, wherein said lead frame has plural electrical leads and said metal plane has connecting projections protruding outwardly from an outer periphery thereof and providing electrical connection to respective said leads of said lead frame when said metal planes are adhered to said corresponding lead frames.

13. A metal plane support as set forth in claim 1, wherein said lead-frame support has guide holes therein, spaced longitudinally therein and outwardly, in the transverse direction, from the lead frames defined therein and said side rails of said metal plane support further comprise guide holes spaced longitudinally therein and transversely, outwardly of said metal planes and respectively aligned with said guide holes of said lead-frame support when said plurality of metal planes are aligned with said plurality of corresponding lead frames.

14. A metal plane support as set forth in claim 1, further comprising electrically insulating tapes disposed between and adhering the respective metal planes to said corresponding lead frames.

15. A metal plane support as set forth in claim 14, wherein said insulating tapes have guide apertures spaced longitudinally along and adjacent to the opposite longitudinal edges thereof and said side rails further comprise respective guide apertures spaced longitudinally therein and aligned with respective said guide apertures of said electrically insulating tapes when adhering said metal plane supports to said corresponding lead frames.

16. A metal plane support structure of a metal plane of a semiconductor device multiple layer lead frame, comprising:

a first metal strip having first and second parallel longitudinal edges, spaced by a first dimension in a direction transverse to the first and second parallel longitudinal edges;

a metal plane defined in the first metal strip, of a substantially rectangular configuration and having a corresponding rectangular periphery defined by a first pair of first and second parallel peripheral edges, respectively parallel to the first and second parallel longitudinal edges of the first metal strip and spaced in the transverse direction by a second dimension less than the first dimension, and a second pair of first and second parallel peripheral edges extending in the transverse direction, the metal plane being substantially centered in the first metal strip, in the transverse direction;

a pair of first and second side rails defined in the metal strip and having respective outer longitudinal edges defined by the respective first and second parallel longitudinal edges of the metal strip and first and second inner longitudinal edges respectively spaced by a common, third dimension in the transverse direction from the first pair of first and second parallel peripheral edges of the metal plane; and at least first and second support bars defined in the first metal strip and extending between and interconnecting the corresponding first and second side rails, respectively, with the first and second parallel longitudinal peripheral edges, respectively, of the metal plane, each of the at least first and second support bars having corresponding, first and second opposite ends, the first ends of the first and second support bars defining integral connections with the first and second parallel longitudinal peripheral edges, respectively, of the metal plane and each integral connection having a separating portion extending longitudinally therein and aligned with the corresponding one of the first and second parallel peripheral edges of the metal plane and the second ends of the first and second support bars defining integral connections with the first and second side rails, respectively, wherein the multilayer lead frame further comprises a lead frame support formed of a second metal strip having a pair of third and fourth parallel longitudinal edges spaced by a fourth transverse dimension, a lead frame of generally rectangular configuration being defined in, and centrally positioned between the parallel longitudinal edges of, the lead frame support, wherein:

the first transverse dimension of the first metal strip is greater than the fourth transverse dimension of the second metal strip; and the first and second metal strips are juxtaposed such that the metal plane of the first metal strip is aligned with the lead frame of the second metal strip, the pair of first and second side rails of the metal plane support being disposed outwardly, in the transverse direction, of the pair of third and fourth longitudinal edges, respectively, of the second metal strip.

17. A metal plane support as set forth in claim 16, wherein each said support bar has an integral connection to said metal plane along a portion of the corresponding longitudinal peripheral edge of said metal plane, the portion having first and second ends, and further comprising: first and second indentations in the metal plane respectively contiguous the first and second ends of the portion and extending from the corresponding longitudinal peripheral edge and inwardly of the metal plane.

18. A metal plane support as set forth in claim 17, wherein:

said metal plane has first and second major surfaces defining a first thickness dimension therebetween; and each said separating portion comprises a groove extending inwardly into the metal plane from one of the first and second main surfaces thereof to a second thickness dimension approximately one-half the first thickness dimension.

19. A metal plane support as set forth in claim 18, wherein said first main surface of said metal plane support defines a corresponding first main surface of each said metal plane to which said corresponding lead frame is adhered and each said groove extends inwardly from the second main surface of said metal plane support.

20. A metal plane support as set forth in claim 18, wherein said metal plane support further comprises section bars extending transversely to and integrally interconnecting said pair of first and second side rails, each said section bar being disposed adjacent a corresponding one of said pair of first and second transversely extending parallel peripheral edges of said metal plane and having respective separating portions therein adjacent the respective integral connections thereof with said pair of first and second side rails.

21. A metal plane support as set forth in claim 20, wherein each said separating portion of each said section bar comprises a groove extending inwardly into the metal plane from one of the first and second main surfaces thereof to a second thickness dimension approximately one-half the first thickness dimension.

22. A metal plane support as set forth in claim 21, wherein each said separating portion of each said section bar further comprises at least one slot disposed along said groove and extending through said metal plane support.

23. A metal plane support as set forth in claim 21, wherein said first main surface of said metal plane support defines a corresponding first main surface of said metal plane to which said corresponding lead frame is adhered and each said groove extends inwardly from the second main surface of said metal plane support.

24. A metal plane support as set forth in claim 16, further comprising:
at least a further said metal plane at a corresponding and successive, longitudinally spaced position in the metal plane support; and
at least a further said lead-frame at a corresponding and successive, longitudinally spaced position in said lead frame support.

25. A metal plane support structure as recited in claim 16, further comprising a second said metal strip, said first and second metal strips respectively having defined therein a power-supply metal plane and a ground metal plane of the multi-layer lead frame.

26. A support structure of a semiconductor device multi-layer lead frame, comprising:
at least first and second metal strips, each having corresponding first and second parallel longitudinal edges, spaced by a first dimension in a direction transverse to the first and second parallel longitudinal edges and respectively having defined therein alternating plural metal planes of at least first and second different types of metal planes of the multi-layer lead frame, the plural metal planes of a common type being spaced longitudinally in the respective metal strip;
each of the common metal planes defined in a respective metal strip being of a substantially rectangular configuration and having a corresponding rectangular periphery defined by a first pair of first and second parallel peripheral edges, respectively parallel to the first and second parallel longitudinal edges of the respective metal strip and spaced in the transverse direction by a second dimension less than the first dimension and a second pair of first and second parallel peripheral edges extending in the transverse direction, and being substantially centered in the respective metal strip, in the transverse direction;
each of the at least first and second metal strips further comprising:
a pair of first and second side rails defined therein and having respective outer longitudinal edges defined by the respective first and second parallel longitudinal edges thereof and first and second inner longitudinal edges respectively spaced by a common, third dimension in the transverse direction from the first pair of first and second parallel peripheral edges of the common metal planes defined therein, and
at least first and second support bars defined therein, corresponding to each metal plane and extending between and interconnecting the first and second side rails, respectively, with the first and second parallel longitudinal peripheral edges, respectively, of the corresponding metal plane, each of the at least first and second support bars having corresponding, opposite ends thereof defining respective integral connections with the first and second side rails and with the first and second parallel longitudinal peripheral edges of the metal plane and further having a respective separating portion at the integral connection of the end thereof with the respective one of the first and second parallel peripheral edges of the metal plane; and
a lead frame support formed of a further metal strip having a pair of third and fourth parallel longitudinal edges spaced by a fourth transverse dimension and having defined therein plural lead frames, each of generally rectangular configuration and centrally positioned between the parallel longitudinal edges of the lead frame support and spaced longitudinally therein, wherein:
the first transverse dimension of each of the at least first and second metal strips is greater than the fourth transverse dimension of the further metal strip, and
the at least first and second metal strips are juxtaposed such that corresponding, said respective metal planes of the at least first and second types are aligned with each other and with a corresponding lead frame of the further metal strip, the corresponding pairs of first and second side rails of the at least first and second metal plane supports being disposed outwardly, in the transverse direction, of the pair of third and fourth longitudinal edges, respectively, of the further metal strip.

* * * * *

UNITED STATES PATENT AND TRADEMARK OFFICE
CERTIFICATE OF CORRECTION

PATENT NO. : 5,410,180
DATED : April 25, 1995
INVENTOR(S) : Fujii et al.

It is certified that error appears in the above-indentified patent and that said Letters Patent is hereby corrected as shown below:

Col. 1, line 24 after "together" insert --,--.

Col. 4, line 2, after "line" insert --, or groove--;
      line 12, after "support" insert --structure---

Col. 7, line 4, after "times" insert --,--.

Signed and Sealed this

Eighth Day of August, 1995

Attest:

BRUCE LEHMAN

Attesting Officer      Commissioner of Patents and Trademarks